United States Patent [19]
Proscia et al.

[11] Patent Number: 5,314,716
[45] Date of Patent: May 24, 1994

[54] NITROGEN DOPED CARBON FILMS

[75] Inventors: James W. Proscia, Dearborn; Gang G. Wen; Keith B. Williams, both of Detroit; Charles H. Winter, Grosse Pointe Park; Gene P. Reck, Detroit, all of Mich.

[73] Assignee: Ford Motor Company, Dearborn, Mich.

[21] Appl. No.: 2,005

[22] Filed: Jan. 8, 1993

[51] Int. Cl.$^5$ .................. C23C 16/00; C01B 21/06
[52] U.S. Cl. ......................... 427/248.1; 427/249; 427/255.1; 423/364; 423/414; 423/445 R; 423/496
[58] Field of Search ............... 427/248.1, 249, 255.1; 423/364, 414, 445 R, 494

[56] References Cited

U.S. PATENT DOCUMENTS 5,094,915  3/1992  Subramaniam ............... 428/408

FOREIGN PATENT DOCUMENTS 6270208  3/1987  Japan .

Primary Examiner—Shrive Beck
Assistant Examiner—David M. Maiorana
Attorney, Agent, or Firm—Lorraine S. Melotik; Roger L. May

[57] ABSTRACT

Nitrogen doped polymeric carbon is prepared by reacting stannic chloride with a primary amine at an elevated temperature. The process is useful for coating glass to make reduced solar energy transmittance automotive and architectural glazings.

12 Claims, No Drawings

NITROGEN DOPED CARBON FILMS

FIELD OF THE INVENTION

This invention relates generally to the preparation of nitrogen doped polymeric carbon. More particularly, the invention is directed to a method for depositing nitrogen doped carbon films onto substrates such as glass.

BACKGROUND OF THE INVENTION

Nitrogen doped polymeric carbon may be deposited onto the surface of a glass sheet for the preparation of reduced solar energy transmittance automotive and architectural glazings. Such coated glazings are generally neutral in color and can be produced at thicknesses which result in a high shading coefficient. Additionally, such coatings are conductive and therefore may be used as a component in a heatable or electroactive glazing system.

Several products have been developed by the glass industry for use as automotive or architectural glazings having reduced solar energy transmittance. Such glazings are designed to admit some light but exclude much of the solar energy from the interior of an automobile or building. For example, it is well known that a quantity of iron may be introduced into glass to produce a bluish-green glazing which absorbs infrared energy and has a moderate shading coefficient. An alternative method for producing a low solar energy transmittance glazing is to coat the glass or plastic substrate with a metal, metal oxide, or other compound which absorbs or reflects solar radiation. Such coatings may be deposited by well-known methods such as, for example, chemical vapor deposition, thermal evaporation, sputtering, and the like.

Carbon films may be grown on glass substrates by Plasma-assisted chemical vapor deposition, wherein a microwave or radio-frequency generated discharge is directed into a gaseous mixture of hydrogen and a hydrocarbon. The carbon-containing gas mixture is highly dissociated by the action of the electromagnetic discharge, resulting in a carbon growth rate of several microns per hour at temperatures in the range from about 800° C. to about 1,000° C.

U.S. Pat. No. 5,094,915 to Subramaniam discloses the deposition of nitrogen doped polymeric carbon films onto substrates such as glass. A mixture of carbon monoxide and nitrogen is irradiated with a carbon monoxide laser in the presence of the substrate. The carbon monoxide and nitrogen molecules react preferentially with and/or adhere to the surface of the substrate.

It would be desirable to prepare nitrogen doped polymeric carbon by a conventional chemical vapor deposition technique, and to use this technique for coating glass sheets to prepare reduced solar energy transmittance automotive and architectural glazings.

SUMMARY OF THE INVENTION

Accordant with the present invention, a process for preparing nitrogen doped polymeric carbon surprisingly has been discovered. The process comprises contacting stannic chloride with a primary amine at a temperature sufficient to form the nitrogen doped polymeric carbon.

Also contemplated by the present invention is a process for depositing a nitrogen doped polymeric carbon film onto a surface of a substrate, comprising contacting stannic chloride with a primary amine adjacent the surface of the substrate at a temperature sufficient to form a film of nitrogen doped polymeric carbon on said surface.

The processes of the present invention are particularly well suited for preparing solar control automotive and architectural coated glazings.

DETAILED DESCRIPTION OF THE PREFERRED EMBODIMENT

The present invention is directed to the preparation of nitrogen doped polymeric carbon, and substrates coated with same.

The first reactant for use in preparing nitrogen doped polymeric carbon according to the present invention is stannic chloride. Stannic chloride is a well-known chemical reagent, which may be prepared by reacting together chlorine and tin metal. Further details concerning the manufacture and properties of stannic chloride are more fully set forth in Kirk-Othmer "Concise Encyclopedia of Chemical Technology," John Wiley & Sons, New York (1985) pp. 1179–1181.

The second reactant for use in preparing nitrogen doped polymeric carbon according to the present invention is a primary amine. Examples of contemplated equivalent primary amines having the same operability and utility include, without limitation, t-butylamine, sec-butylamine, isopropylamine, isobutylamine, ethylenediamine, methylamine, ethylamine, n-butylamine, isobutylamine, cyclohexylamine, benzylamine, tetramethylenediamine, hexamethylenediamine, t-octylamine, aniline, and the like, as well as mixtures thereof. Useful amines include, but are not limited to, straight or branched alkyl amines containing 1 to about 8 carbon atoms, and mixtures thereof. Preferred amines comprise t-butylamine, sec-butylamine, isopropylamine, and t-octylamine, as well as mixtures thereof.

In a preferred embodiment of the present invention, the stannic chloride and primary amine each, individually, may be vaporized, and the vapors combined adjacent the surface of a hot glass substrate to prepare glass having a film of nitrogen doped polymeric carbon thereon. The vaporized reactants may conveniently be conveyed to the reaction site by means of an inert carrier gas such as nitrogen. The ratio of stannic chloride and the amine employed in the reaction mixture may vary on a mole basis from about 1:0.5 to about 1:100. The reaction preferably is carried out utilizing a mole ratio of stannic chloride to primary amine from about 1:1 to about 1:50. The temperature at which the reaction occurs is not sharply critical, and lies within a broad range from about 400° C. to about 1,100° C. The reaction, when conducted adjacent the surface of a hot glass ribbon, is generally carried out at conventional glass processing temperatures from about 500° C. to about 700° C. Moreover, the reaction may proceed within or without a float glass facility tin bath, utilizing a conventional coater such as is set forth in U.S. Pat. No. 4,922,853 which is incorporated herein in its entirety by reference thereto.

As will be readily apparent to those ordinarily skilled in the art, the required reaction temperature may be achieved by conventional methods, such as by heating the stannic chloride and primary amine reactant streams before contacting them together, or may be achieved by directing the reactant streams together adjacent a heated substrate, e.g., a hot glass ribbon produced by the well-known float glass process.

Nitrogen doped polymeric carbon films may be deposited onto substrates such as glass by the process of the present invention at thicknesses from about 20 Angstroms to about 5,000 Angstroms. A preferred thickness range, suitable for preparing reduced solar energy transmittance glazings, is from about 100 Angstroms to about 2,000 Angstroms. Such films may be deposited onto virtually any substrate that can withstand the reaction temperature, including, without limitation, glass, ceramic, quartz, metals, metaloids, etc. A preferred substrate is a glass ribbon produced by a float glass facility. The glass may be of any thickness generally known in the industry as useful for making electrical components or automotive or architectural glazings.

The nitrogen doped polymeric carbon films of the present invention generally contain from about 40 to about 100 mole percent carbon and from about 10 to about 60 mole percent nitrogen. Tin generally comprises from about 0.05 to about 10 mole percent of the deposited film. Preferably, the nitrogen doped polymeric carbon films comprise from about 70% to about 98% carbon, from about 2% to about 30% nitrogen, and from about 0.05% to about 5% tin.

The process conditions are not sharply critical for the successful preparation of glazings having nitrogen doped polymeric carbon films thereon, according to the present invention. The chemical reactions and process conditions described hereinabove are generally disclosed in terms which are conventional to the practice of the present invention. Occasionally, however, the process conditions as described may not be applicable for each chemical reactant included within the disclosed scope. Those reactants for which this occurs will readily be recognizable to those ordinarily skilled in the art. In all such cases, either the process may be successfully performed by conventional modifications known to those of ordinary skill in the art, e.g., by changing to alternative conventional chemical reactants, or other process conditions which are otherwise conventional will be applicable to the practice of the present invention.

EXAMPLE

Gaseous stannic chloride at a concentration of about 1.7 mole percent in an inert nitrogen carrier gas stream is reacted with gaseous isopropyl amine at a concentration of about 40 mole percent in an inert nitrogen carrier gas stream. The contacting of the two reactants is conducted in a controlled fashion by interposing a flow of inert nitrogen between the reactant streams as they emerge from a gas injector. The reactants are directed toward a heated glass substrate maintained at a temperature of about 500° C. where they react to form a nitrogen doped carbon film. The film is dark and mirror-like in appearance, and comprises about 90 mole percent carbon and about 8.3 mole percent nitrogen, along with negligible amounts of tin, chlorine, and oxygen. The film is conductive, and has a sheet resistance of about 5,000 ohms per square.

What is claimed is:

1. A process for preparing nitrogen doped polymeric carbon, comprising contacting stannic chloride with a primary amine at a temperature sufficient to form nitrogen doped polymeric carbon comprising at least about 40 mole percent carbon.

2. The process for preparing nitrogen doped polymeric carbon according to claim 1, wherein the stannic chloride is contacted with the primary amine in a mole ratio from about 1:0.5 to about 1:100.

3. The process for preparing nitrogen doped polymeric carbon according to claim 2, wherein the mole ratio is from about 1:1 to about 1:50.

4. The process for preparing nitrogen doped polymeric carbon according to claim 1, wherein the stannic chloride is contacted with the primary amine at a temperature from about 400° C. to about 1,100° C.

5. The process for preparing nitrogen doped polymeric carbon according to claim 4, wherein the temperature is from about 500° C. to about 700° C.

6. The process for preparing nitrogen doped polymeric carbon according to claim 1, wherein the primary amine is selected from the group consisting of straight and branched primary alkyl amines containing from 1 to about 8 carbon atoms.

7. A process for depositing a nitrogen doped polymeric carbon film onto a surface of a substrate, comprising contacting stannic cholride with a primary amine adjacent the surface of the substrate at a temperature sufficient to form a film of nitrogen doped polymeric carbon, comprising at least about 40 mole percent carbon, on said surface.

8. The process for depositing a nitrogen doped polymeric carbon film onto a surface of a substrate according to claim 7, wherein the stannic chloride is contacted with the primary amine in a mole ratio from about 1:0.5 to about 1:100.

9. The process for depositing a nitrogen doped polymeric carbon film onto a surface of a substrate according to claim 8, wherein the mole ratio is from about 1:1 to about 1:50.

10. The process for depositing a nitrogen doped polymeric carbon film onto a surface of a substrate according to claim 7, wherein the stannic chloride is contacted with the primary amine at a temperature from about 400° C. to about 1,100° C.

11. The process for depositing a nitrogen doped polymeric carbon film onto a surface of a substrate according to claim 10, wherein the temperature is from about 500° C. to about 700° C.

12. The process for depositing a nitrogen doped polymeric carbon film onto a surface of a substrate according to claim 7, wherein the primary amine is selected from the group consisting of straight and branched primary alkyl amines containing from 1 to about 8 carbon atoms.

* * * * *